(12) United States Patent
Choi et al.

(10) Patent No.: US 10,707,443 B2
(45) Date of Patent: Jul. 7, 2020

(54) ORGANIC LIGHT-EMITTING DISPLAY APPARATUS AND MANUFACTURING METHOD OF THE SAME

(71) Applicant: Samsung Display Co., Ltd., Yongin-si, Gyeonggi-do (KR)

(72) Inventors: Jinhwan Choi, Yongin-si (KR); Taewoong Kim, Yongin-si (KR); Taean Seo, Yongin-si (KR); Younggug Seol, Yongin-si (KR); Pilsuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/059,149

(22) Filed: Mar. 2, 2016

(65) Prior Publication Data

US 2017/0012242 A1    Jan. 12, 2017

(30) Foreign Application Priority Data

Jul. 7, 2015  (KR) .................. 10-2015-0096777

(51) Int. Cl.
  *H01L 51/52* (2006.01)
  *H01L 27/32* (2006.01)
  *H01L 51/56* (2006.01)

(52) U.S. Cl.
  CPC ...... *H01L 51/5256* (2013.01); *H01L 27/3244* (2013.01); *H01L 51/56* (2013.01)

(58) Field of Classification Search
  CPC ............. H01L 51/5256; H01L 51/5253; H01L 51/5237
  See application file for complete search history.

(56) References Cited

U.S. PATENT DOCUMENTS

| 8,664,851 | B2* | 3/2014 | Jeon ............. H01L 51/5253 313/500 |
| 9,843,013 | B2* | 12/2017 | Sonoda ............... H01L 51/524 |
| 10,181,580 | B2* | 1/2019 | Ishida ................. G09F 9/30 |

(Continued)

FOREIGN PATENT DOCUMENTS

| JP | 2010-027561 A | 2/2010 |
| KR | 10-2013-0040574 A | 4/2013 |

(Continued)

OTHER PUBLICATIONS

Definition of "Align", http://www.thefreedictionary.com (2014).*
Definition of "distal", Google.com (2019) (Year: 2019).*

*Primary Examiner* — Michele Fan
(74) *Attorney, Agent, or Firm* — Lewis Roca Rothgerber Christie LLP

(57) ABSTRACT

An organic light-emitting display apparatus includes a substrate, an inorganic insulation film on the substrate, an organic insulation film on the inorganic insulation film, an organic light-emitting device on the organic insulation film, and an encapsulation unit including a first inorganic film covering the organic light-emitting device and having a first boundary portion contacting the organic insulation film, an organic film covering the first inorganic film and having a second boundary portion contacting the inorganic insulation film, and a second inorganic film covering the organic film and having a third boundary portion contacting the substrate.

7 Claims, 8 Drawing Sheets

(56) References Cited

U.S. PATENT DOCUMENTS

| | | | | |
|---|---|---|---|---|
| 2003/0117066 | A1* | 6/2003 | Silvernail | H01L 51/5237 313/504 |
| 2003/0164674 | A1* | 9/2003 | Imamura | H05B 33/04 313/493 |
| 2003/0207500 | A1* | 11/2003 | Pichler | H01L 51/5253 438/127 |
| 2004/0031977 | A1* | 2/2004 | Brown | H01L 51/5246 257/222 |
| 2004/0124770 | A1* | 7/2004 | Hayashi | H01L 51/5203 313/506 |
| 2004/0247949 | A1* | 12/2004 | Akedo | C23C 16/347 428/704 |
| 2005/0098113 | A1* | 5/2005 | Hayashi | H01L 51/529 118/718 |
| 2005/0212419 | A1* | 9/2005 | Vazan | H01L 51/5256 313/512 |
| 2005/0269943 | A1* | 12/2005 | Hack | H01L 51/0097 313/504 |
| 2006/0220548 | A1* | 10/2006 | Menda | H01L 51/5243 313/512 |
| 2007/0114521 | A1* | 5/2007 | Hayashi | H01L 51/5246 257/40 |
| 2007/0159089 | A1* | 7/2007 | Oh | H01L 27/3223 313/506 |
| 2010/0019654 | A1 | 1/2010 | Hayashi | |
| 2010/0187986 | A1* | 7/2010 | Kajitani | H01L 51/524 313/504 |
| 2010/0210047 | A1* | 8/2010 | Sasaki | H01L 51/5256 438/26 |
| 2010/0244073 | A1* | 9/2010 | Ito | H05B 33/04 257/98 |
| 2011/0049730 | A1* | 3/2011 | Schmid | C23C 16/0272 257/787 |
| 2011/0156062 | A1* | 6/2011 | Kim | H01L 51/0097 257/88 |
| 2012/0091477 | A1* | 4/2012 | Kim | H01L 51/5246 257/88 |
| 2012/0146492 | A1* | 6/2012 | Ryu | H01L 51/5256 313/512 |
| 2013/0092972 | A1 | 4/2013 | Kim et al. | |
| 2013/0207083 | A1* | 8/2013 | Young | H01L 51/5237 257/40 |
| 2013/0328480 | A1* | 12/2013 | Joo | H05B 33/04 313/512 |
| 2014/0117342 | A1 | 5/2014 | Kwon et al. | |
| 2014/0138641 | A1* | 5/2014 | Yi | H01L 27/3244 257/40 |
| 2014/0138651 | A1* | 5/2014 | Oh | H01L 51/5253 257/40 |
| 2014/0159000 | A1* | 6/2014 | Kang | H01L 51/5253 257/40 |
| 2014/0159002 | A1* | 6/2014 | Lee | H01L 27/3246 257/40 |
| 2014/0367661 | A1* | 12/2014 | Akagawa | H01L 51/5256 257/40 |
| 2015/0021565 | A1 | 1/2015 | Min et al. | |
| 2015/0027541 | A1* | 1/2015 | Baisl | H01L 51/448 136/263 |
| 2015/0034920 | A1* | 2/2015 | Jang | H01L 51/5256 257/40 |
| 2015/0048319 | A1* | 2/2015 | Moon | H01L 51/5253 257/40 |
| 2015/0048331 | A1* | 2/2015 | Kwack | H01L 51/5253 257/40 |
| 2015/0195915 | A1* | 7/2015 | Namkung | B32B 37/26 361/750 |
| 2015/0349294 | A1* | 12/2015 | Lee | H01L 51/5246 257/40 |
| 2015/0380474 | A1* | 12/2015 | Lee | H01L 51/5262 257/40 |
| 2016/0043348 | A1* | 2/2016 | Zhang | H01L 51/5256 257/40 |
| 2016/0064690 | A1* | 3/2016 | Kook | H01L 51/5256 257/40 |
| 2016/0072099 | A1* | 3/2016 | Okamoto | H01L 51/5253 257/40 |
| 2016/0126498 | A1* | 5/2016 | Kim | H01L 51/5253 257/40 |
| 2016/0190519 | A1* | 6/2016 | Cho | H01L 51/5253 257/98 |
| 2016/0343988 | A1* | 11/2016 | Meyer | H01L 51/5256 |
| 2016/0351852 | A1* | 12/2016 | Kim | H01L 51/5256 |
| 2017/0033313 | A1* | 2/2017 | Kim | H01L 27/32 |
| 2017/0040399 | A1* | 2/2017 | Hirase | H01L 51/50 |
| 2017/0279082 | A1* | 9/2017 | Grabowski | H01L 51/0097 |
| 2018/0040849 | A1* | 2/2018 | Ishida | H01L 51/50 |
| 2018/0047940 | A1* | 2/2018 | Sonoda | H05B 33/04 |

FOREIGN PATENT DOCUMENTS

| | | |
|---|---|---|
| KR | 10-2014-0055608 A | 5/2014 |
| KR | 10-2015-0011231 A | 1/2015 |
| KR | 10-2015-0014053 A | 2/2015 |

\* cited by examiner

ORGANIC LIGHT-EMITTING DISPLAY APPARATUS AND MANUFACTURING METHOD OF THE SAME

CROSS-REFERENCE TO RELATED APPLICATION

This application claims priority to, and the benefit of, Korean Patent Application No. 10-2015-0096777, filed on Jul. 7, 2015 in the Korean Intellectual Property Office, the entire content of which is incorporated herein by reference.

BACKGROUND

1. Field

Aspects of one or more exemplary embodiments relate to an organic light-emitting display device and a manufacturing method of the same, and more particularly, to an organic light-emitting display device to block the introduction of oxygen and moisture from outside of the organic light-emitting display device, and a manufacturing method of the same.

2. Description of the Related Art

Among display apparatuses, an organic light-emitting display apparatus has advantages, such as wider viewing angles, higher brightness, and faster response speeds, and stands out as the display apparatus of future generations.

Generally, the organic light-emitting display apparatus includes thin film transistors and organic light-emitting devices on a substrate, such that the organic light-emitting devices operate to emit light. The organic light-emitting display apparatus may be used as a display unit for smaller products, such as a portable phone, or may be used as a display unit for larger products, such as a television set.

The organic light-emitting display apparatus may be weakened by the permeation of external oxygen and moisture. Accordingly, an encapsulation layer is formed to cover the organic light-emitting device to protect the organic light-emitting device from oxygen and moisture.

However, although a conventional manufacturing method of a conventional organic light-emitting display apparatus may reduce or prevent permeation of moisture through an upper side of an organic light-emitting device, it is difficult to prevent the permeation of moisture through a side portion of a film disposed below the organic light-emitting device in the conventional organic light-emitting display apparatus.

Information disclosed in this Background section is for enhancement of understanding of the background of the invention, and may contain information that does not form the prior art.

SUMMARY

One or more exemplary embodiments are directed toward an organic light-emitting display apparatus to prevent or substantially prevent the introduction of external oxygen and moisture, and a method of manufacturing the same.

Additional aspects will be set forth in part in the description which follows and, in part, will be apparent from the description, or may be learned by practice of the presented embodiments.

According to one or more exemplary embodiments, an organic light-emitting display apparatus may include a substrate, an inorganic insulation film on the substrate, an organic insulation film on the inorganic insulation film, an organic light-emitting device on the organic insulation film, and an encapsulation unit including a first inorganic film covering the organic light-emitting device and having a first boundary portion contacting the organic insulation film, an organic film covering the first inorganic film and having a second boundary portion contacting the inorganic insulation film, and a second inorganic film covering the organic film and having a third boundary portion contacting the substrate.

According to one or more exemplary embodiments, a distal end of the first inorganic film may match a distal end of the organic insulation film.

According to one or more exemplary embodiments, a distal end of the organic film may match a distal end of the inorganic insulation film.

According to one or more exemplary embodiments, the organic insulation film may have an area smaller than an area of the inorganic insulation film.

According to one or more exemplary embodiments, the first inorganic film may have an area smaller than that of the organic film, and the organic film may have an area smaller than that of the second inorganic film.

According to one or more exemplary embodiments, the organic insulation film may include an upper surface on which the organic light-emitting device is not located and a distal end, and the first inorganic film may contact the upper surface of the organic insulation film and may not contact the distal end of the organic insulation film.

According to one or more exemplary embodiments, the distal end of the organic insulation film may contact the organic film.

According to one or more exemplary embodiments, the inorganic insulation film may include an upper surface on which the organic insulation film is not located and a distal end, and the organic film may contact the upper surface of the inorganic insulation film and may not contact the distal end of the inorganic insulation film.

According to one or more exemplary embodiments, the distal end of the inorganic insulation film may contact the second inorganic film.

According to one or more exemplary embodiments, a manufacturing method of an organic light-emitting display apparatus may include forming an inorganic insulation film on a substrate, forming an organic insulation film on the inorganic insulation film, forming an organic light-emitting device on the organic insulation film, forming a first inorganic film to cover the organic light-emitting device and having a first boundary portion of the first inorganic film contact the organic insulation film, forming an organic film to cover the first inorganic film and having a second boundary portion of the organic film contact the inorganic insulation film, and forming a second inorganic film to cover the organic film and having a third boundary portion of the second inorganic film contact the substrate.

According to one or more exemplary embodiments, the manufacturing method may further include removing an outer portion of the organic insulation film, which is not covered by the first inorganic film, by using the first inorganic film as a mask between the forming the first inorganic film and the forming the organic film.

According to one or more exemplary embodiments, a distal end of the first inorganic film may match a distal end of the organic insulation film.

According to one or more exemplary embodiments, the manufacturing method may further include removing an outer portion of the inorganic insulation film, which is not covered by the organic film, by using the organic film as a mask between the forming the organic film and the forming the second inorganic film.

According to one or more exemplary embodiments, a distal end of the organic film may match a distal end of the inorganic insulation film.

According to one or more exemplary embodiments, the organic insulation film may have an area smaller than that of inorganic insulation film.

According to one or more exemplary embodiments, the organic film may cover the entire first inorganic film, and the second inorganic film may cover the entire organic film.

According to one or more exemplary embodiments, the organic insulation film may include an upper surface on which the organic light-emitting device is not formed and a distal end, and the first inorganic film may contact the upper surface of the organic insulation film and may not contact the distal end of the organic insulation film.

According to one or more exemplary embodiments, the distal end of the organic insulation film may contact the organic film.

According to one or more exemplary embodiments, the inorganic insulation film may include an upper surface on which the organic insulation film is not formed and a distal end, and the organic film may contact the upper surface of the inorganic insulation film and may not contact the distal end of the inorganic insulation film.

According to one or more exemplary embodiments, the distal end of the inorganic insulation film may contact the second inorganic film.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
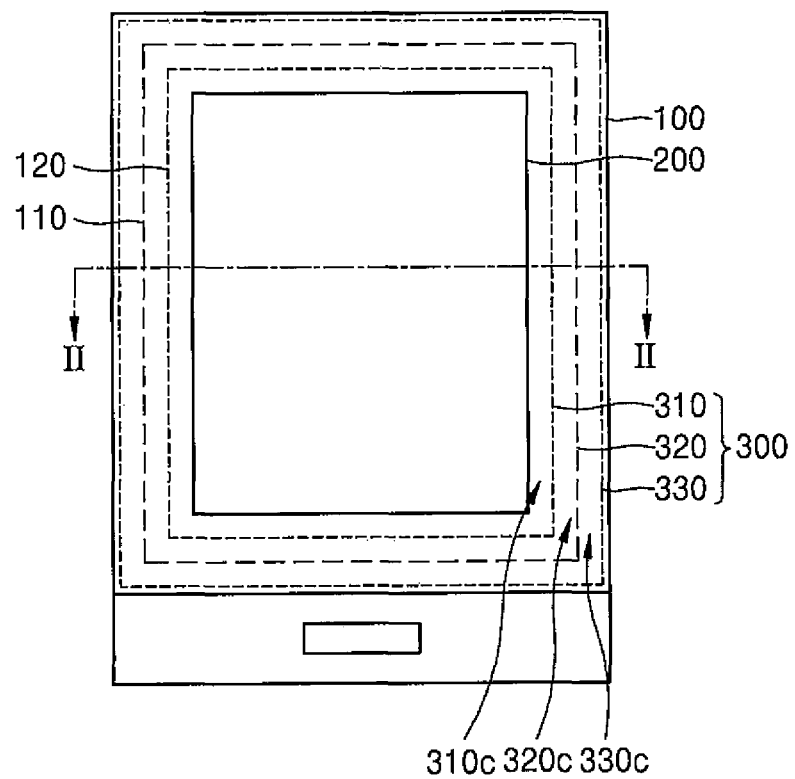
FIG. 1 is a plan view schematically illustrating an organic light-emitting display apparatus according to an embodiment of the present invention.

The present exemplary embodiments may have different forms and embodiments and should not be construed as being limited to the descriptions set forth herein. Accordingly, the exemplary embodiments are merely described below, by referring to the figures, to explain aspects of the present invention.

Reference will now be made in detail to exemplary embodiments, examples of which are illustrated in the accompanying drawings, wherein like reference numerals refer to like elements throughout.

It will be understood that although the terms "first", "second", etc. may be used herein to describe various components, these components should not be limited by these terms. These components are only used to distinguish one component from another.

Expressions such as "at least one of," when preceding a list of elements, modify the entire list of elements and do not modify the individual elements of the list. Further, the use of "may" when describing embodiments of the present invention refers to "one or more embodiments of the present invention." As used herein, the singular forms "a", "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
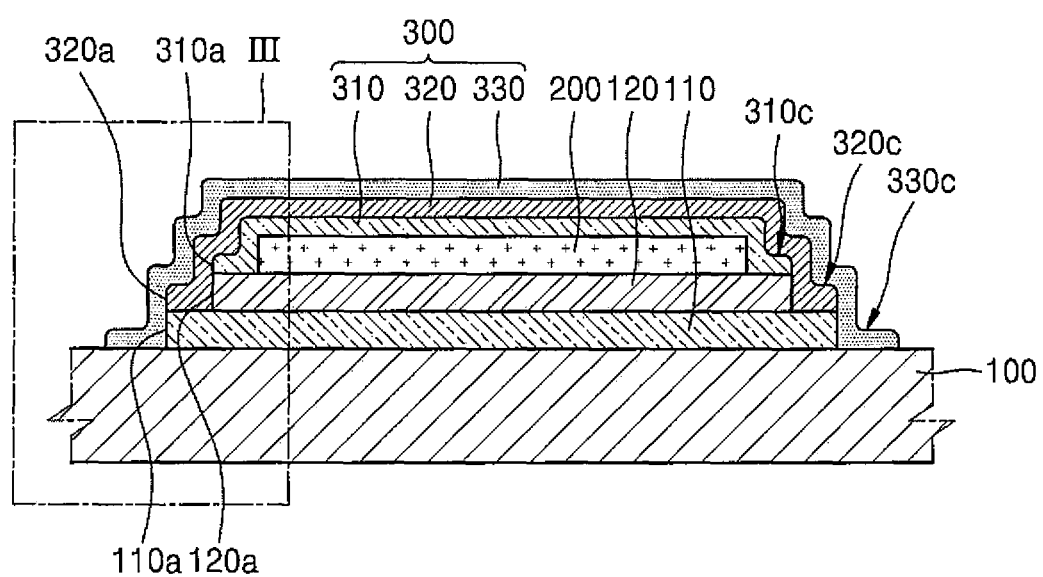
FIG. 2 is a cross-sectional view schematically illustrating a cross-section of the line II-II of the organic light-emitting display apparatus of FIG. 1.

FIG. 1 is a plan view schematically illustrating an organic light-emitting display apparatus according to an embodiment of the present invention, and FIG. 2 is a cross-sectional view schematically illustrating a cross-section of the line II-II of the organic light-emitting display apparatus of FIG. 1.

Referring to FIGS. 1 and 2, the organic light-emitting display apparatus according to an embodiment of the present invention includes a substrate 100, an inorganic insulation film 110 on the substrate 100, an organic insulation film 120 on the inorganic insulation film 110, an organic light-emitting device 200 on the organic insulation film 120, and an encapsulation unit 300 covering the organic light-emitting device 200.

The substrate 100 may include various materials, such as glass, metal, and plastic materials. When the substrate 100 has a characteristic of flexibility, the substrate 100 may include plastic material, such as polyethylene terephthalate (PET), polyethylene naphthalate (PEN), or polyimide, to thereby have excellent thermal resistance and durability, and to thereby allow the substrate 100 to be curved.

Figure 3:
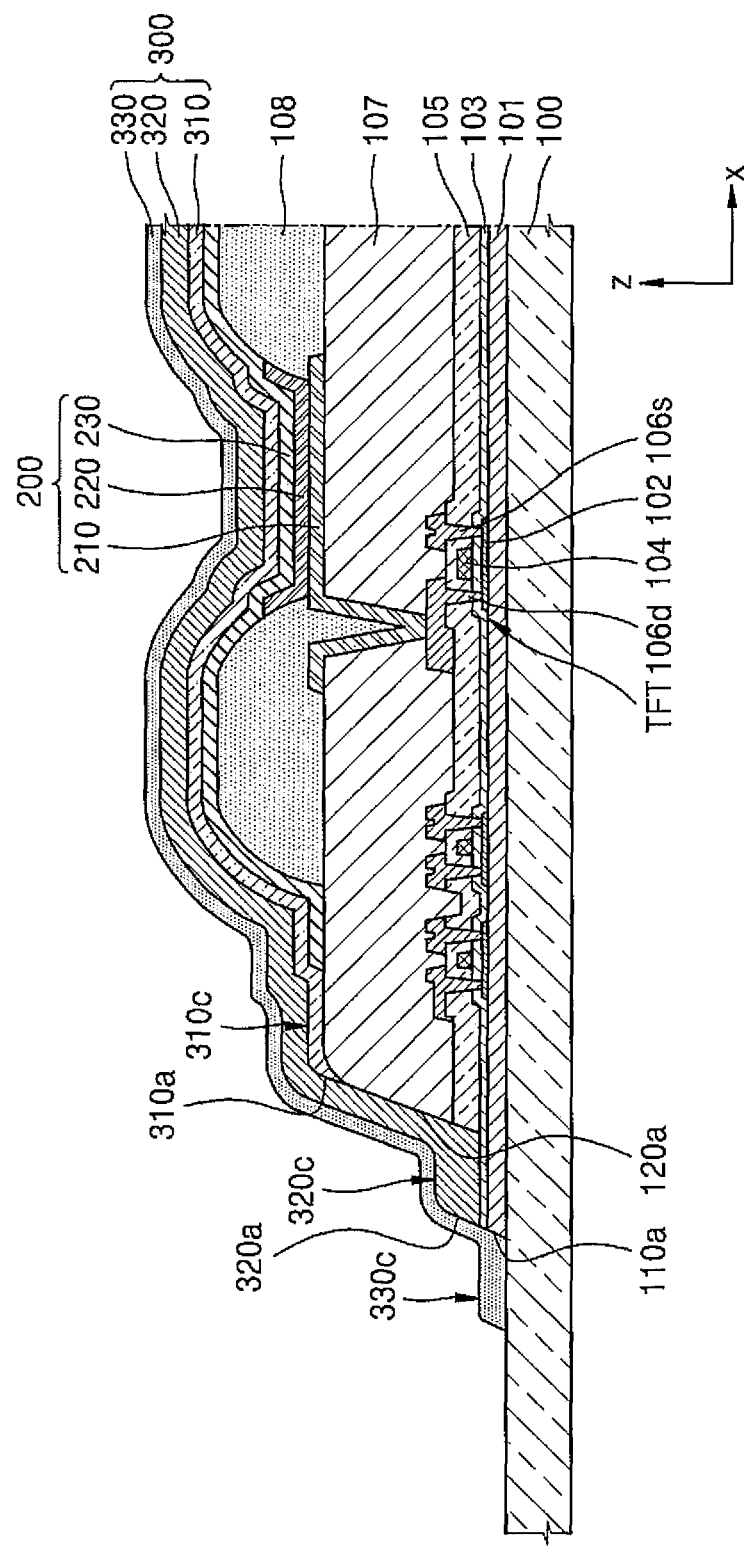
FIG. 3 is a cross-sectional view illustrating in detail the region III of the organic light-emitting display apparatus of FIG. 2.

The inorganic insulation film 110 may be disposed on the substrate 100. The inorganic insulation film 110 may include a single layer or a multilayer. The inorganic insulation film 110 may include some layers forming a backplane of the organic light-emitting display apparatus, and may include silicon oxide or silicon nitride, for example. The inorganic insulation film 110 may include, or may be on, a buffer layer 101 and/or a gate insulation film 103, as shown in FIG. 3, although the present invention is not limited thereto. The inorganic insulation film 110 may be one of various layers forming the backplane of the organic light-emitting display apparatus as long as one layer includes an inorganic compound.

The encapsulation unit 300, which will be described in detail later, may contact an outer portion of the substrate 100 on which the inorganic insulation film 110 is not disposed, that is, may contact an upper surface 100b (shown in FIG. 8) of the substrate 100. In detail, a second inorganic film 330 of the encapsulation unit 300 may contact the upper surface 100b of the substrate 100, which is adjacent the inorganic insulation film 110. In other words, a boundary portion 330c of the second inorganic film 330, as seen in FIG. 2, may contact the substrate 100. The organic insulation film 120 may be disposed on the inorganic insulation film 110. The organic insulation film 120 may include a single layer or a multilayer. The organic insulation film 120 may include various layers that form the backplane of the organic light-emitting display apparatus, and may include an acrylic polymer, such as poly(methyl methacrylate) (PMMA), polystyrene (PS), a polymer derivative having a phenol group, imide polymer, an acryl ester-based polymer, an amide-based polymer, a fluorine-based polymer, a p-xylene polymer, a vinyl alcohol polymer, and/or a mixture thereof, for example.

Figure 6:
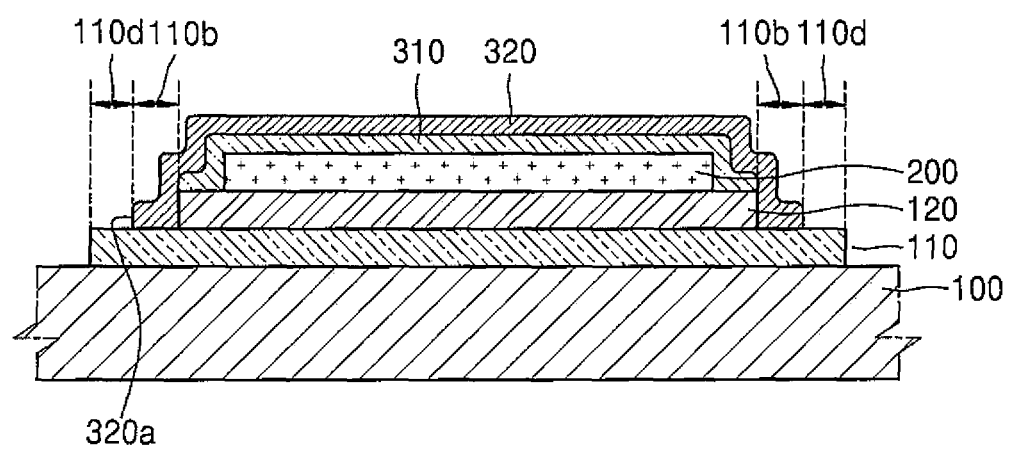

The encapsulation unit 300, which will be described later, may contact an upper surface 110b (shown in FIG. 6) of the inorganic insulation film 110 on which the organic insulation film 120 is not disposed. The upper surface 110b may be, as shown in FIG. 6, a portion of the entire upper surface of the inorganic insulation film 110. In detail, an organic film 320 of the encapsulation unit 300 may contact the upper surface 110b of the inorganic insulation film 110. In other words, a boundary portion 320c of the organic film 320, as seen in FIG. 2, may contact the inorganic insulation film 110.

The organic insulation film 120 may be disposed only on the inorganic insulation film 110. As illustrated in FIG. 1, the organic insulation film 120 may be disposed on a center portion of the inorganic insulation film 110, the upper surface 110b of the inorganic insulation film 110 at which the boundary portion 320c is formed surrounds the organic insulation film 120, and the organic insulation film 120 may be disposed on the inorganic insulation film 110 except on the upper surface 110b of the inorganic insulation film 110. Accordingly, the organic insulation film 120 may have an area that is smaller than an area of the inorganic insulation film 110.

Figure 4:
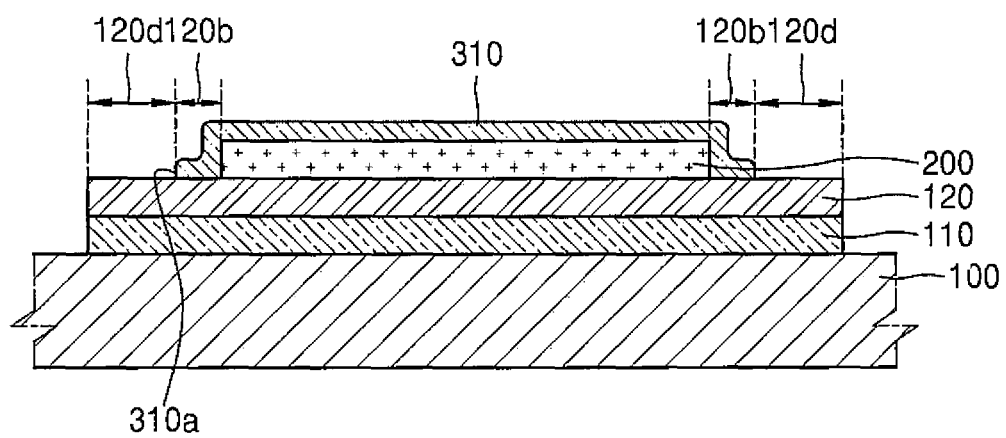
FIGS. 4 to 8 are cross-sectional views schematically illustrating a manufacturing method of an organic light-emitting display apparatus according to an embodiment of the present invention.

The organic light-emitting device 200 may be disposed on the organic insulation film 120. The organic light-emitting device 200 may be electrically connected to a thin film transistor TFT, shown in FIG. 3, which is disposed on the inorganic insulation film 110 or on the organic insulation film 120. The organic light-emitting device 200 may be disposed only on the organic insulation film 120. The organic light-emitting device 200 may be on a center portion of the organic insulation film 120. Also, an upper surface 120b of the organic insulation film 120 (FIG. 4) surrounds the organic light-emitting device 200, and the organic light-emitting device 200 may be disposed on the organic insulation film 120 except on the upper surface 120b of the organic insulation film 120. The upper surface 120b may be, as shown in FIG. 4, a portion of the entire upper surface of the organic insulation film 120.

Since an intermediate layer 220 (shown in FIG. 3) of the organic light-emitting device 200 may include an organic compound, the organic light-emitting device 200 may be weakened by, or may be susceptible to, oxygen or moisture introduced from outside of the organic light-emitting device 200. Accordingly, the encapsulation unit 300 may be disposed on the organic light-emitting device 200 to protect various components of the organic light-emitting device 200.

The encapsulation unit 300 may be disposed on the organic light-emitting device 200. The encapsulation unit 300 may include a first inorganic film 310, the organic film 320, and the second inorganic film 330, which are sequentially disposed on the organic light-emitting device 200. In other words, the first inorganic film 310 may be on the organic light-emitting device 200, the organic film 320 may be on the first inorganic film 310, and the second inorganic film 330 may be on the organic film 320.

As seen in FIG. 2, the first inorganic film 310 is on the organic insulation film 120, and covers the organic light-emitting device 200. Here, a boundary portion 310c of the first inorganic film 310 may contact the organic insulation film 120, which is disposed below the organic light-emitting device 200. That is, the organic insulation film 120 may include the upper surface 120b (shown in FIG. 4) on which the organic light-emitting device 200 is not disposed, which may surround an area of the organic insulation film 120 on which the organic light-emitting device 200 is disposed. The first inorganic film 310 may cover the organic light-emitting device 200, and may contact the upper surface 120b of the organic insulation film 120, which is disposed below the organic light-emitting device 200.

A distal end 310a of the first inorganic film 310, as seen in FIG. 2, may match, or may be aligned with, a distal end 120a of the organic insulation film 120. This structure is formed according to a manufacturing method. When the first inorganic film 310 is formed, an outer portion of the organic insulation film 120, which is disposed outside the distal end 310a of the first inorganic film 310, may be removed by using the first inorganic film 310 as a mask. Accordingly, as illustrated in the plan view of FIG. 1 and in the cross-sectional view of FIG. 2, the distal end 310a of the first inorganic film 310 may match, or may be aligned with, the distal end 120a of the organic insulation film 120.

The organic film 320 may be disposed on the inorganic insulation film 110 and may cover the first inorganic film 310. Here, the boundary portion 320c of the organic film 320 may contact the inorganic insulation film 110, which is disposed below the organic insulation film 120. The inorganic insulation film 110 may include the area of the upper surface 110b (shown in FIG. 6) on which the organic insulation film 120 is not disposed. The upper surface 110b, on which the organic insulation film 120 is not disposed, surrounds the area of the inorganic insulation film 110 on which the organic insulation film 120 is disposed. The organic film 320 may cover the first inorganic film 310, and may contact the upper surface 110b of the inorganic insulation film 110.

The distal end 320a of the organic film 320 may match, or may be aligned with, the distal end 110a of the inorganic insulation film 110. As stated above, this structure may be formed according to a manufacturing method. That is, after the organic film 320 is formed, an outer portion of the inorganic insulation film 110 that is beyond the distal end 320a of the organic film 320 may be removed by using the organic film 320 as a mask, according to the manufacturing method. Accordingly, as illustrated in the plan view of FIG.

1 and in the cross-sectional view of FIG. 2, the distal end 320a of the organic film 320 may match the distal end 110a of the inorganic insulation film 110.

Figure 8:
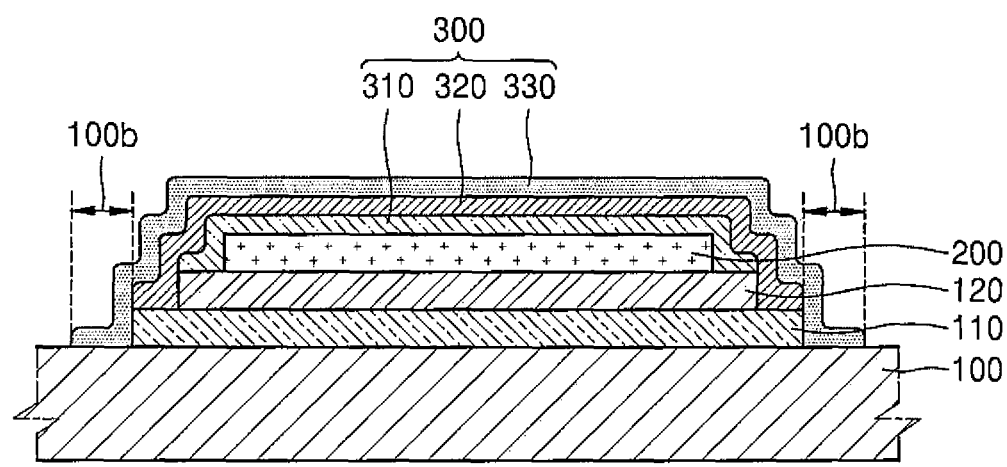

The second inorganic film 330 may be disposed on the substrate 100, and may cover the organic film 320. The boundary portion 330c of the second inorganic film 330 may contact the substrate 100. That is, the substrate 100 may include an upper surface 100b on which the inorganic insulation film 110 is not disposed. The upper surface 100b may be, as shown in FIG. 8, a portion of the entire upper surface of the substrate 100. The upper surface 100b of the substrate 100, on which the inorganic insulation film 110 is not disposed, may surround an area of the substrate 100 on which the inorganic insulation film 110 is disposed. The second inorganic film 330 may cover the organic film 320, and may contact at least a portion of the upper surface 100b of the substrate 100.

In addition, the organic insulation film 120 may include the upper surface 120b (shown in FIG. 4), on which the organic light-emitting device 200 is not disposed, and may also include the distal end 120a (which may be referred to as a side surface of the distal end 120a), seen in FIG. 2. The first inorganic film 310 may contact the upper surface 120b of the organic insulation film 120, but might not contact the surface of the distal end 120a. Here, the distal end 120a of the organic insulation film 120 may contact the organic film 320.

And, as described above, the inorganic insulation film 110 may include the upper surface 110b (shown in FIG. 6), on which the organic insulation film 120 is not disposed, and may include the distal end 110a (which may be referred to as a side surface of the distal end 110a). The organic film 320 may contact the upper surface 110b of the inorganic insulation film 110, but might not contact the distal end 110a of the inorganic insulation film 110. Here, the distal end 110a of the inorganic insulation film 110 may contact the second inorganic film 330.

As such, because the first inorganic film 310, the organic film 320, and the second inorganic film 330 cover the entire organic light-emitting device 200, the organic insulation film 120, and the inorganic insulation film 110, the organic light-emitting display apparatus according to the present embodiment may be sealed from external oxygen and moisture.

FIG. 3 is a cross-sectional view illustrating the region III of the organic light-emitting display apparatus of FIG. 2 in detail.

Referring to FIG. 3, the buffer layer 101 of silicon oxide or silicon nitride is formed on the substrate 100, and then a semiconductor layer 102 is disposed on the buffer layer 101. The buffer layer 101 flattens a surface of the substrate 100, and/or prevents or substantially prevents the introduction of impurities into the semiconductor layer 102 of a thin film transistor TFT.

A gate electrode 104 is disposed above the semiconductor layer 102, and a source electrode 106s and a drain electrode 106d are electrically connected to each other according to a signal applied to the gate electrode 104. In consideration of adhesiveness with an adjacent layer, of surface flatness of a layer to be stacked, and of workability, the gate electrode 104 may be a single layer or a multilayer including at least one material among aluminum (Al), platinum (Pt), palladium (Pd), silver (Ag), magnesium (Mg), Nickel (Ni), Neodymium (Nd), iridium (Ir), chromium (Cr), lithium (Li), calcium (Ca), molybdenum (Mo), titanium (Ti), tungsten (W), and/or Copper (Cu), for example.

The gate insulation film 103 of silicon oxide or silicon nitride may be disposed between the semiconductor layer 102 and the gate electrode 104 to provide insulation of the semiconductor layer 102 and the gate electrode 104.

In the present embodiment, as illustrated in FIGS. 1 and 2, the inorganic insulation film 110 on the substrate 100 may include the buffer layer 101 and/or the gate insulation film 103. However, the present invention is not limited thereto. When the gate insulation film 103 includes an organic compound, the above-described inorganic insulation film 110 may be the buffer layer 101.

An interlayer insulation film 105 may be disposed above the gate electrode 104, and may be a single layer or a multilayer that includes an organic compound. For example, the interlayer insulation film 105 may include an acrylic polymer, such as poly(methyl methacrylate) (PMMA), polystyrene (PS), a polymer derivative having a phenol group, an imide polymer, an acryl ester-based polymer, an amide-based polymer, a fluorine-based polymer, a p-xylene polymer, a vinyl alcohol polymer, and/or a mixture thereof.

In the present embodiment, the organic insulation film 120, which is disposed on the inorganic insulation film 110 as illustrated in FIGS. 1 and 2, may be the interlayer insulation film 105, although the present invention is not limited thereto. The organic insulation film 120 may include an insulation film of an organic compound, which is disposed on the interlayer insulation film 105, in addition to the interlayer insulation film 105.

The source electrode 106s and the drain electrode 106d may be disposed on the interlayer insulation film 105. The source electrode 106s and the drain electrode 106d are electrically connected to the semiconductor layer 102 through a respective contact opening (e.g., a contact hole) formed in the interlayer insulation layer 105 and in the gate insulation film 103. Considering conductivity, the source electrode 106s and the drain electrode 106d may be a single layer or a multilayer, which may include at least one material among aluminum (Al), platinum (Pt), palladium (Pd), silver (Ag), magnesium (Mg), gold (Au), Nickel (Ni), Neodymium (Nd), iridium (Ir), chromium (Cr), lithium (Li), calcium (Ca), molybdenum (Mo), titanium (Ti), tungsten (W), and/or Copper (Cu), for example.

A protection film may cover the thin film transistor TFT to protect the thin film transistor TFT having the above structure. The protection film may include an inorganic compound such as silicon oxide, silicon nitride, or silicon oxynitride.

Further, a planarization film 107 may be disposed over the substrate 100. In this case, the planarization film 107 may be a protection film. The planarization film 107 may flatten an upper portion of the thin film transistor TFT, and may protect the thin film transistor TFT and various components when the organic light-emitting device 200 is disposed above the thin film transistor TFT. The planarization film 107 may include an acryl-based organic compound or benzocyclobutene (BCB), for example.

In addition, a pixel-defining film 108 may be disposed on the thin film transistor TFT. The pixel-defining film 108 may be disposed on the planarization film 107, and may define an opening. The pixel-defining film 108 may define a pixel area over the substrate 100.

The pixel-defining film 108 may be the organic insulation film 120, for example. The organic insulation film 120 may include an acrylic polymer such as poly(methyl methacrylate) (PMMA), polystyrene (PS), a polymer derivative having a phenol group, an imide polymer, an acryl ester-based polymer, an amide-based polymer, a fluorine-based polymer, a p-xylene polymer, a vinyl alcohol polymer, and/or a mixture thereof.

Further, the organic light-emitting device 200 may be disposed on the pixel-defining film 108. The organic light-emitting device 200 may include a pixel electrode 210, the intermediate layer 220 including an emission layer (EML), and an opposite electrode 230.

The pixel electrode 210 may be a semi-transparent electrode or a reflective electrode. When the pixel electrode 210 is a semi-transparent electrode, the pixel electrode 210 may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include a reflective layer having silver (Ag), magnesium (Mg), aluminum (Al), platinum (Pt), palladium (Pd), gold (Au), Nickel (Ni), Neodymium (Nd), Iridium (Ir), chromium (Cr), and a mixture thereof, and a layer including indium tin oxide (ITO), indium zinc oxide (IZO), zinc oxide (ZnO), indium oxide ($In_2O_3$), indium gallium oxide (IGO), or aluminum zinc oxide AZO. The present invention is not limited thereto, however. Various materials may be included in the pixel electrode 210, and a structure of the pixel electrode 210 may be variously changed to various forms, for example, a single layer or a multilayer.

The intermediate layer 220 may be disposed in the pixel area defined by the pixel-defining film 108. The intermediate layer 220 may include an emission layer that emits light according to an electrical signal. In addition to the emission layer, the intermediate layer 220 may be a single layer, or a complex structure including a hole injection layer (HIL) between the emission layer and the pixel electrode 210, a hole transport layer (HTL), and an electron transport layer (ETL) between the emission layer and the opposite electrode 230, or an electron injection layer. However, the intermediate layer 220 is not limited thereto, and may have various structures.

The opposite electrode 230 may be disposed over the entire substrate 100 to cover the intermediate layer 220 including the emission layer, and to correspond to the pixel electrode 210. The opposite electrode 230 may be a semi-transparent electrode or a reflective electrode.

When the opposite electrode 230 is a semi-transparent electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof, and a (semi-) transparent conductive layer of indium tin oxide (ITO), indium zinc oxide (IZO), zinc oxide (ZnO), or indium oxide ($I-n_2O_3$). When the opposite electrode 230 is a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof. However, the structure and material of the opposite electrode 230 are not limited thereto, and they may be changed variously.

In the above-described structure, the inorganic insulation film 110 may include the buffer layer 101 and the gate insulation film 103, and the organic insulation film 120 may include the interlayer insulation film 105 and the planarization film 107, and may also include the pixel-defining film 108 in some cases. However, these structures are exemplary. The interlayer insulation film 105 and the gate insulation film 103 may be included in the organic insulation film 120 or the inorganic insulation film 110 according to the materials from which they are made.

The encapsulation unit 300 may be disposed on the opposite electrode 230 to cover the opposite electrode 230. The encapsulation unit 300 may be multilayered, including one or more inorganic films and the organic film 320. In the present embodiment, the first inorganic film 310, the organic film 320, and the second inorganic film 330 may be sequentially arranged.

The first inorganic film 310 may cover the organic light-emitting device 200. The boundary portion 310c of the first inorganic film 310 may contact the organic insulation film 120, that is, the planarization film 107, which is disposed below the organic light-emitting device 200. The present embodiment describes the planarization film 107 as the organic insulation film 120, however, it is not limited thereto. The organic film 320 may contact the interlayer insulation film 105 in some cases. In the present embodiment, the planarization film 107 may have an upper portion, on which the organic light-emitting device 200 is not disposed, and the first inorganic film 310 may cover the pixel-defining film 108, may be disposed on the organic light-emitting device 200 and the pixel-defining film 108, and may contact the upper portion of the planarization film 107.

The distal end 310a of the first inorganic film 310 may match, or may be aligned with, a distal end 120a of the organic insulation film 120 comprising the interlayer insulation film 105 and the planarization layer 107. This structure may be formed according to a manufacturing method of embodiments of the present invention. That is, after the first inorganic film 310 is formed, an outer portion of the interlayer insulation film 105 and an outer portion of the planarization layer 107 disposed outside the first inorganic film 310 may be removed by using the first inorganic film 310 as a mask according to the manufacturing method of the present embodiment.

The organic film 320 may cover the first inorganic film 310. The boundary portion 320c of the organic film 320 may contact the inorganic insulation film 110, that is, the gate insulation film 103, which is disposed below the organic insulation film 120.

That is, the gate insulation film 103 may have an upper portion on which the interlayer insulation film 105 is not disposed, and the organic film 320 may cover the first inorganic film 310, and may contact the upper portion of the gate insulation film 103 disposed below the interlayer insulation film 105.

In the present embodiment, the inorganic insulation film 110 may include the gate insulation film 103 and the buffer layer 101, and thus, the organic film 320 contacts the upper portion of the gate insulation film 103. In some embodiments, when the gate insulation film 103 is formed as the organic insulation film 120 and when the buffer layer 101 is the inorganic insulation film 110, the organic film 320 may contact an upper portion of the buffer layer 101.

The distal end 320a of the organic film 320 may match, or may be aligned with, the distal end 110a of the inorganic insulation film 110 (e.g., a distal end of the gate insulation film 103 and the buffer layer 101). As stated above, this structure may be formed according to a manufacturing method. After the organic film 320 is formed, outer portions of the gate insulation film 103 and the buffer layer 101, on which the organic film 320 is not disposed, are removed by using the organic film 320 as a mask according to the manufacturing method.

The second inorganic film 330 may cover the organic film 320. The boundary portion 330c of the second inorganic film 330 may contact the substrate 100. That is, the substrate 100 may have the upper portion 100b on which the gate insulation film 103 and the buffer layer 101 are not disposed, and the second inorganic film 330 may cover the organic film 320 and contact the upper portion 100b of the substrate 100.

As described above, the interlayer insulation film 105 may have an upper portion on which the organic light-emitting device 200 is not disposed, and a distal end (or distal end surface). The first inorganic film 310 may contact the upper portion of the interlayer insulation film 105, and might not contact the distal end 120a of the interlayer insulation film 105. In this case, the distal end 120a of the interlayer insulation film 105 may contact the organic film 320.

Further, as described above, the inorganic insulation film 110 may have an upper portion on which the organic insulation film 120 is not disposed, and may also have the distal end 110a. That is, the gate insulation film 103 may have an upper portion on which the interlayer insulation film 105 is not disposed, and the organic film 320 may contact the upper portion of the gate insulation film 103 while not contacting the distal end 110a of the gate insulation film 103 and the buffer layer 101. Here, the distal end 110a of the gate insulation film 103 and the buffer layer 101 may contact the second inorganic film 330.

As such, the organic light-emitting display apparatus according to the present embodiment may be completely sealed from external oxygen and moisture because the first inorganic film 310, the organic film 320, and the second inorganic film 330 sequentially cover the organic light-emitting device 200, the organic insulation film 120, and the inorganic insulation film 110.

Although the organic light-emitting display apparatus is described above, the present invention is not limited thereto. For example, a manufacturing method of an organic light-emitting display apparatus to manufacture the organic light-emitting display apparatus may also be within the scope of the present invention.

FIGS. 4 to 8 are cross-sectional views schematically illustrating a manufacturing method of an organic light-emitting display apparatus according to an embodiment of the present invention.

Referring to FIG. 4, the inorganic insulation film 110 and the organic insulation film 120 are disposed on the substrate 100. The inorganic insulation film 110 and the organic insulation film 120 may be disposed on the entire substrate 110, and may have a same area or substantially the same area as the substrate 100. Thereafter, the organic light-emitting device 200 is disposed on the organic insulation film 120.

After the organic light-emitting device 200 is formed, the first inorganic film 310 is disposed on an opposite electrode of the organic light-emitting device 200. The first inorganic film 310 may be disposed to cover the entire organic light-emitting device 200. Here, covering the entire organic light-emitting device 200 may be referred to as covering an upper portion of the organic light-emitting device 200 while also entirely covering an upper portion and a distal end (a side surface) of the pixel-defining film 108, which defines a light-emitting area. The boundary portion 310c (see FIG. 2) of the first inorganic film 310 is disposed to contact an area of the upper surface 120b of the organic insulation film 120 at which the organic light-emitting device 200 is not disposed. Here, an outer portion 120d of the organic insulation film 120, on which the first inorganic film 310 is not disposed, may be exposed outside.

Figure 5:
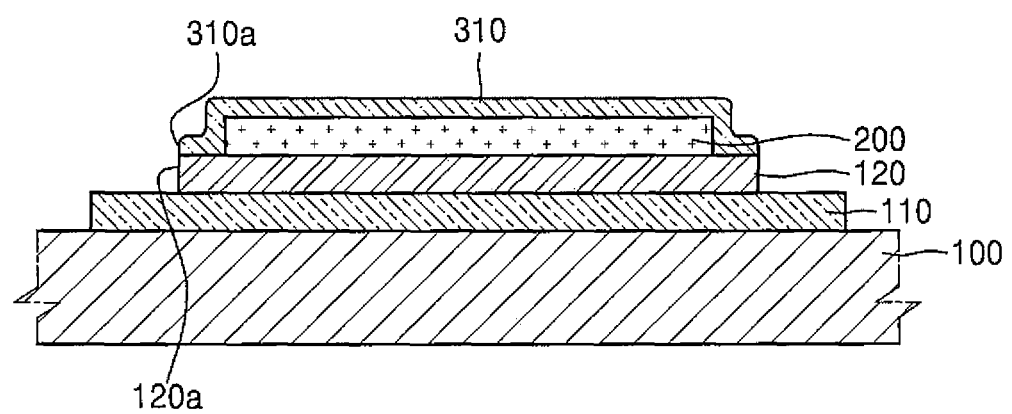

Referring to FIGS. 4 and 5, the outer portion 120d of the organic insulation film 120, on which the first inorganic film 310 is not disposed, may be removed. The outer portion 120d of the organic insulation film 120 may be removed so that the distal end 120a of the organic insulation film 120 matches, or is aligned with, the distal end 310a of the first inorganic film 310. During the process of removing the outer portion 120d of the organic insulation film 120, the first inorganic film 310 is used as a mask to remove the exposed outer portion 120d of the organic insulation film 120, and may be removed according to organic film dry etching. Through this process, the outer portion 120d of the organic insulation film 120, which is disposed outside the first inorganic film 310, may be removed without using a separate mask. And, according to this process, the distal end 310a of the first inorganic film 310 and the distal end 120a of the organic insulation film 120 may be formed to match each other, as shown in FIG. 5.

Referring to FIG. 6, the organic film 320 is disposed on the first inorganic film 310. The organic film 320 may cover the entire first inorganic film 310. Here, covering the entire first inorganic film 310 may be referred to as covering an upper portion of the first inorganic film 310, while also entirely covering an upper portion and a distal end (a side surface) of the first inorganic film 310. The boundary portion 320c (see FIG. 2) of the organic film 320 may contact the upper surface 110b of the first inorganic insulation film 110 on which the organic insulation film 120 is not disposed. That is, the organic film 320 may cover the first inorganic film 310 and may also contact the distal end 120a of the organic insulation film 120 and the upper surface 110b of the inorganic insulation film 110. Here, an outer portion 110d of the inorganic insulation film 110 on which the organic film 320 is not disposed may be exposed outside.

Figure 7:
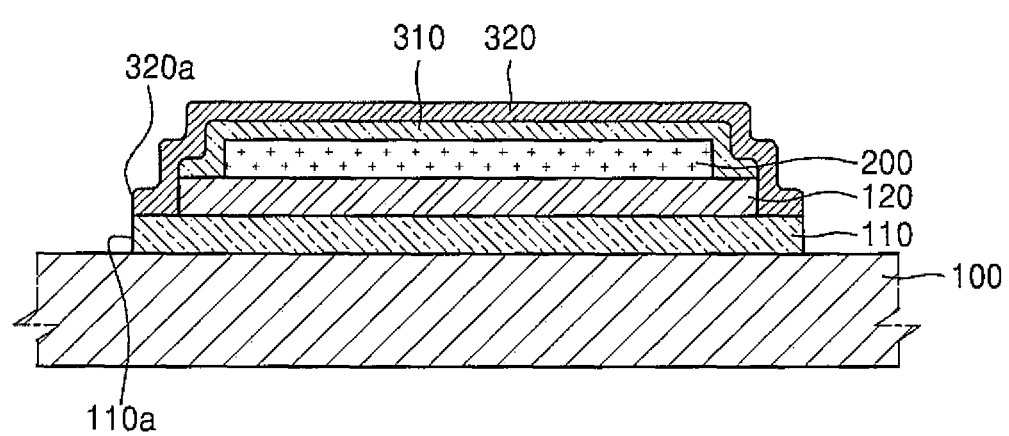

Referring to FIGS. 6 and 7, the outer portion 110d of the inorganic insulation film 110 on which the organic film 320 is not disposed is removed. The outer portion 110d of the inorganic insulation film 110 may be removed so that the distal end 110a of the inorganic insulation film 110 matches the distal end 320a of the organic film 320. In the process of removing the outer portion 110d of the inorganic insulation film 110, the outer portion 110d of the inorganic insulation film 110, which is not covered by the organic film 320 but is instead exposed, may be removed by using the organic film 320 as a mask according to inorganic film dry etching. Through this process, the outer portion 110d of the inorganic insulation film 110, which is disposed outside the organic film 320, may be removed without using a separate mask. And through this process, the distal end 320a of the organic film 320 and the distal end 110a of the inorganic insulation film 110 may match each other, as shown in FIG. 7.

Referring to FIG. 8, the second inorganic film 330 is disposed on the organic film 320. The second inorganic film 330 may cover the entire organic film 320. Here, the covering the entire organic film 320 may be referred to as covering an upper portion of the organic film 320 and also entirely covering an upper portion and a distal end (a side surface) of the organic film 320. The boundary portion 330c of the second inorganic film 330 may contact the upper surface 100b of the substrate on which the inorganic insulation film 110 is not disposed. At this time, the second inorganic film 330 may contact the distal end 110a of the inorganic insulation film 110.

As such, because the first inorganic film 310, the organic film 320, and second inorganic film 330 are sequentially disposed to cover the entire organic light-emitting device 200, to cover the entire organic insulation film 120, and to cover the entire inorganic insulation film 110, the organic light-emitting display apparatus according to the present embodiment may be completely sealed from external oxygen or moisture.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their respective equivalents.

What is claimed is:

1. An organic light-emitting display apparatus comprising:
    a substrate;
    an inorganic insulation film on the substrate;
    an organic insulation film on the inorganic insulation film;
    an organic light-emitting device on the organic insulation film; and
    an encapsulation unit comprising:
        a first inorganic film covering the organic light-emitting device and having a first boundary portion contacting the organic insulation film;
        an organic film covering the first inorganic film and having a second boundary portion directly contacting a first side of the inorganic insulation film; and
        a second inorganic film covering the organic film and having a third boundary portion directly contacting the substrate,
        wherein a distal end of the first inorganic film is coplanar with a distal end of the organic insulation film; and
        wherein a distal end of the organic film is coplanar with a distal end of the inorganic insulation film, the distal end of the inorganic insulation film being a second side extending from the first side in a direction towards the substrate.

2. The organic light-emitting display apparatus of claim 1, wherein the organic insulation film has an area that is smaller than an area of the inorganic insulation film.

3. The organic light-emitting display apparatus of claim 1, wherein the first inorganic film has an area that is smaller than that of the organic film, and
    wherein the organic film has an area that is smaller than that of the second inorganic film.

4. The organic light-emitting display apparatus of claim 1, wherein the organic insulation film comprises an upper surface having a portion on which the organic light-emitting device is not located, and
    wherein the first inorganic film contacts the upper surface of the organic insulation film, and does not contact the distal end of the organic insulation film.

5. The organic light-emitting display apparatus of claim 4, wherein the distal end of the organic insulation film contacts the organic film.

6. An organic light-emitting display apparatus comprising:
    a substrate:
    an inorganic insulation film on the substrate;
    an organic insulation film on the inorganic insulation film;
    an organic light-emitting device on the organic insulation film; and
    an encapsulation unit comprising:
        a first inorganic film covering the organic light-emitting device and having a first boundary portion contacting the organic insulation film;
        an organic film covering the first inorganic film and having a second boundary portion directly contacting the inorganic insulation film; and
        a second inorganic film covering the organic film and having a third boundary portion directly contacting the inorganic insulation film; and
    wherein a distal end of the first inorganic film is coplanar with a distal end of the organic insulation film;
    wherein a distal end of the organic film is coplanar with a distal end of the inorganic insulation film;
    wherein the inorganic insulation film comprises the distal end and an upper surface, and
    wherein the organic film contacts the upper surface of the inorganic insulation film, and does not contact the distal end of the inorganic insulation film.

7. The organic light-emitting display apparatus of claim 6, wherein the distal end of the inorganic insulation film contacts the second inorganic film.

* * * * *